(12) United States Patent
Jayaraman

(10) Patent No.: US 7,084,492 B2
(45) Date of Patent: Aug. 1, 2006

(54) UNDERFILL AND MOLD COMPOUNDS INCLUDING SILOXANE-BASED AROMATIC DIAMINES

(75) Inventor: Saikumar Jayaraman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/611,618

(22) Filed: Jun. 30, 2003

(65) Prior Publication Data

US 2004/0262750 A1    Dec. 30, 2004

(51) Int. Cl.
H01L 23/48    (2006.01)

(52) U.S. Cl. ............................ 257/687; 257/783

(58) Field of Classification Search ............... 257/778, 257/780, 686, 685, 687, 783, 734; 438/113, 438/108
See application file for complete search history.

(56) References Cited

U.S. PATENT DOCUMENTS

| | | | | |
|---|---|---|---|---|
| 3,660,434 A | * | 5/1972 | Patterson | 549/215 |
| 5,728,473 A | * | 3/1998 | Inoue et al. | 428/448 |
| 5,834,848 A | * | 11/1998 | Iwasaki | 257/778 |
| 5,922,167 A | * | 7/1999 | Rosenfeld | 156/331.5 |
| 5,935,372 A | * | 8/1999 | Rojstaczer et al. | 156/329 |
| 6,156,820 A | * | 12/2000 | Choi | 523/176 |
| 6,174,751 B1 | * | 1/2001 | Oka | 438/113 |
| 6,429,238 B1 | | 8/2002 | Sumita et al. | |
| 6,444,921 B1 | * | 9/2002 | Wang et al. | 174/260 |
| 6,512,031 B1 | | 1/2003 | Honda et al. | |
| 6,518,091 B1 | * | 2/2003 | Haba | 438/107 |
| 6,518,096 B1 | * | 2/2003 | Chan et al. | 438/118 |
| 6,813,134 B1 | * | 11/2004 | Tatsumi et al. | 361/234 |
| 2003/0116347 A1 | | 6/2003 | Kubo et al. | |

FOREIGN PATENT DOCUMENTS

JP    2002194053    7/2002

OTHER PUBLICATIONS

Notification of Transmittal of the International Search Report and The Written Opinion of the International Searching Authority, or the Declaration, International Appl. No. PCT/US2004/019371.

* cited by examiner

*Primary Examiner*—Howard Weiss
*Assistant Examiner*—(Vikki) Hoa B. Trinh
(74) *Attorney, Agent, or Firm*—Blakely, Sokoloff, Taylor & Zafman LLP

(57) ABSTRACT

An apparatus including a first substrate comprising a first set of contact points; a second substrate including a second set of contact points coupled to the first substrate through interconnections between a portion of the first set of contact points a portion of the second set of contact points; and a composition disposed between the first substrate and the second substrate including a siloxane-based aromatic diamine.

11 Claims, 1 Drawing Sheet

UNDERFILL AND MOLD COMPOUNDS INCLUDING SILOXANE-BASED AROMATIC DIAMINES

BACKGROUND

1. Field

Integrated circuit packaging.

2. Background

Integrated circuits chip or die are typically assembled into a package that is soldered to a printed circuit board. A chip or die may have contacts on one surface that are used to electrically connect the chip or die to the package substrate and correspondingly an integrated circuit to the package substrate. Accordingly, a suitable substrate may have corresponding contacts on one surface. One way a number of contacts of a chip or die are connected to contacts of a package substrate are through solder ball contacts in, for example, a controlled collapse chip connect (C4) process.

A package substrate may be constructed from a composite material that has a coefficient of thermal expansion (CTE) that is different than a coefficient of thermal expansion of the chip or die. Variations in the temperature of the package may cause a resultant differential expansion between the chip and the package substrate. The differential expansion may induce stresses that can crack the connections between the chip and the package substrate (e.g., crack one or more solder bumps). The connections carry electrical current between the chip and the package substrate so that any crack in the connections may effect the operation in the circuit.

Typically, a package such as described may include an underfill material that is located between the chip and the package substrate. The underfill material is typically an epoxy that improves the solder joint reliability and also provides mechanical/moisture stability to the package configuration. A package may have hundreds of connections (e.g., solder bumps) arranged in a two-dimensional array across a surface of the chip, between the chip and the substrate package. An underfill is typically applied to the interface of the chip and package substrate by dispensing a line of uncured underfill material along one side of the interface. The underfill then flows between the connections.

A chip or die mounted to a package substrate may be overmolded with a mold compound to provide a level of protection from environmental effects such as moisture and contaminants. A typical overmolding process places a solid or semi-solid molding compound over the chip using a mold press. The package is then transferred through a heated mold that causes the molding compound to flow and encapsulate the chip.

Typical underfill materials and mold compound materials are epoxy based, i.e., epoxy resin. The resin is formed by combining the epoxy with a hardener. Typical hardeners for underfill and mold compound are amine-based systems or phenolic-based systems. A mold compound may also include fillers such as ceramics or silica.

In terms of reliability performance, four properties of an underfill and mold compound materials are generally considered important. These include low CTE, low modulus, adhesion, and high fracture toughness of the cured resin. Methylene diamines as a hardener in epoxy underfill or mold compound have been found to have good adhesion to polyimides and substrates. Toughness for this system is provided by addition of elastomers such as long chain aliphatic silicone-functionalized epoxies. Although the addition of, for example, long chain aliphatic silicone epoxies, improves fracture toughness, the glass transition temperature ($T_g$) of the resin has been observed to drop with increased addition of the silicone elastomers. The addition of the silicone elastomers are also expected to increase the viscosity of the resin, thus reducing the flow of a resin under a chip as an underfill composition. Finally, the use of methylene-based aromatic diamines must be handled cautiously as these compounds are known carcinogenics.

One problem associated with underfill compositions is that the underfill composition on cure tends to increase the warpage of the package (e.g., a package including chip and package substrate). Warpage has been observed to impact package coplanarity especially on ball grid array (BGA) packages, resulting in stressed joints post reflow. Stressed joints can result in increased solder joint fatigue failures. Also, with the increased die size, more stresses are anticipated, particularly at the die edges. Currently, all packages are expected to meet lead-free soldered reflow requirements. For materials to pass lead-free reflow conditions, high adhesion and low package stress is important.

In the non-central processing unit (CPU) area, stack height of a package is an important parameter. One tendency of the industry is to make packages thinner with more functionality. Decreasing package thickness means developing thinner mold compositions/underfills and less warpage, with better reliability performance.

BRIEF DESCRIPTION OF THE DRAWINGS

Features, aspects, and advantages of embodiments will become more thoroughly apparent from the following detailed description, appended claims, and accompanying drawings in which:

DETAILED DESCRIPTION

Figure 1:
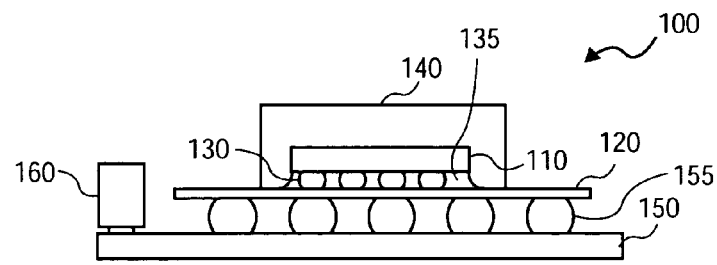
FIG. 1 shows a package connected to a motherboard.

A composition is described. In one embodiment, the composition is useful as an underfill formulation between a chip and a package substrate. In another embodiment, the composition is useful as a molding compound over a chip and a package substrate. An apparatus is also described. In one embodiment, an apparatus includes a chip connected to a package substrate with an underfill formulation disposed between the chip and the package substrate and, in another embodiment, a molding compound disposed on the chip over a package substrate.

In one embodiment, a composition suitable as an underfill formulation or a molding compound is an epoxy-based system including an epoxy and a hardener. One suitable composition for a hardener is a siloxane-based aromatic diamine. One suitable siloxane-based aromatic diamine has the general formula:

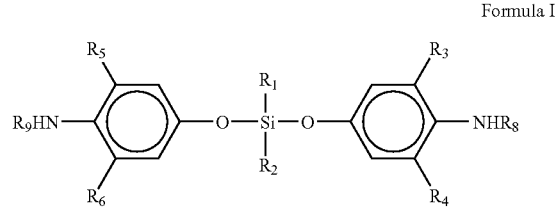

Formula I

In Formula I, groups $R_1$ and $R_2$ are independently selected from a hydrogen (H), an alkyl, a substituted alkyl, a cycloaliphatic, an alkyl ether (e.g., methyl ether, ethyl ether, etc.) an aryl, and a substituted aryl moiety, and an —$OR_7$ moiety, wherein $R_7$ is selected from an aliphatic and an aromatic moiety. Groups $R_3$, $R_4$, $R_5$, $R_6$, $R_8$ and $R_9$ are independently selected from a hydrogen (H), an alkyl, a substituted alkyl, a cycloaliphatic, an alkyl ether, an aryl and a substituted aryl moiety.

In the above general formula, alkyl denotes an acyclic saturated or unsaturated aliphatic straight or branched chain hydrocarbon. —$CH_2$, —$CH_2CH_3$, —$CH_2CH_2CH_2CH_3$, —$CH_2CH_2CH_2CH_2CH_3$ are examples of saturated straight chain alkyl moieties. —$CH_2CH=CHCH_3$ is an example of an olefin or unsaturated alkyl moiety. An example of a monocyclic aliphatic saturated hydrocarbon moiety is cyclohexane. An example of a substituted alkyl moiety is a moiety wherein, for example, a hydrogen atom is replaced with an inert atom. An aryl may denote an aromatic ring, a substituted aromatic ring, and fused aromatic rings. Phenyl, hydroxyphenyl, and napthalene are examples of aryl moieties.

With respect to an underfill formulation or a molding compound, a composition such as a siloxane-based aromatic diamine may be combined with an epoxy. In circuit packaging processes, epoxies are favored. Reasons for the popularity of an epoxy as a component of an underfill formulation or molding compound include the versatility of epoxy and tuning the properties of the overall formulation or compound, good adhesion to various substrates, low cure shrinkage, good electrical properties, compatibility with many materials, and the ability of an epoxy to cure under a wide variety of conditions. Bisphenol-A, bisphenol-F or napthalene-based epoxy resins are suitable materials for underfill formulations and/or molding compounds.

An embodiment of a molding compound includes, but is not limited to, an epoxy system including an epoxy (e.g., bisphenol-A, bisphenol-F, nathalene), a siloxane-based aromatic diamine, and a filler. Suitable fillers include, but are not limited to, ceramics such as silica, alumina, etc.

Representative siloxane-based aromatic diamines include, but are not limited to, the following:

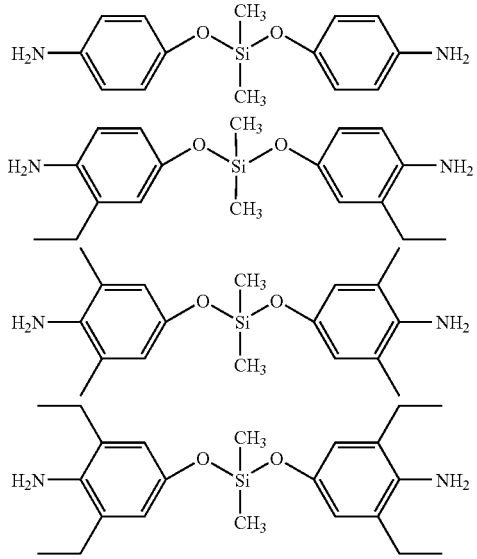

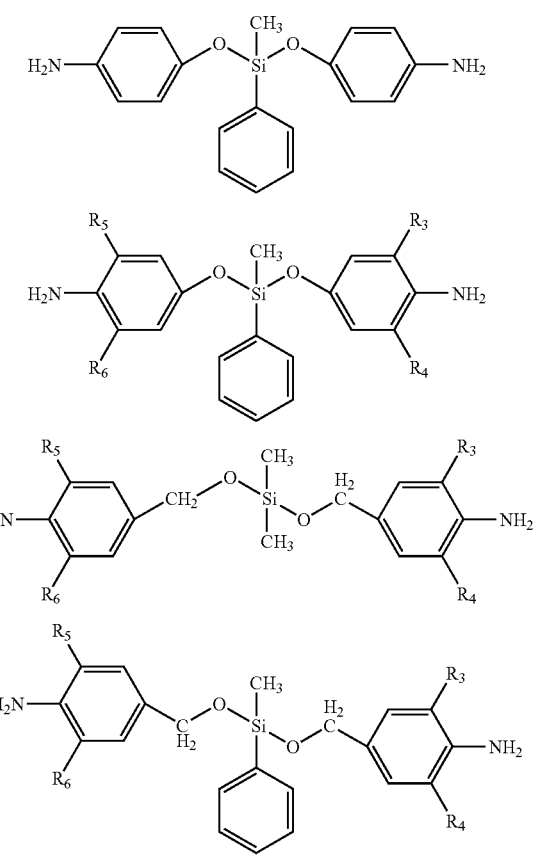

where $R_3$, $R_4$, $R_5$, and $R_6$ are independently selected from H, methyl, ethyl, propyl, etc. moieties; and

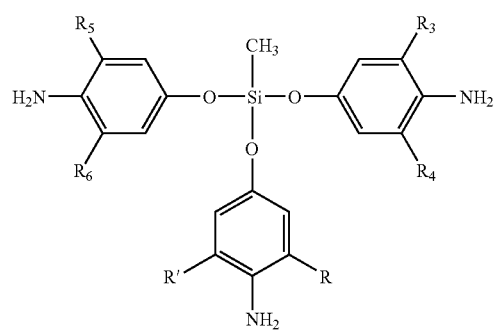

where $R_3$, $R_4$, $R_5$, and $R_6$ are independently selected from H, methyl, ethyl, propyl, etc. moieties; and R and R' are independently selected from methyl, ethyl, propyl, etc. moieties.

Suitable siloxane-based aromatic diamines for use as a hardener as described above may be commercially available. For example, bis(p-aminophenoxy)dimethyl silane (CAS 1223-16-1) is commercially available from Gelest, Inc. of Morrisville, Pa. Alternatively, suitable siloxane-based aromatic diamines may be synthesized generally as follows:

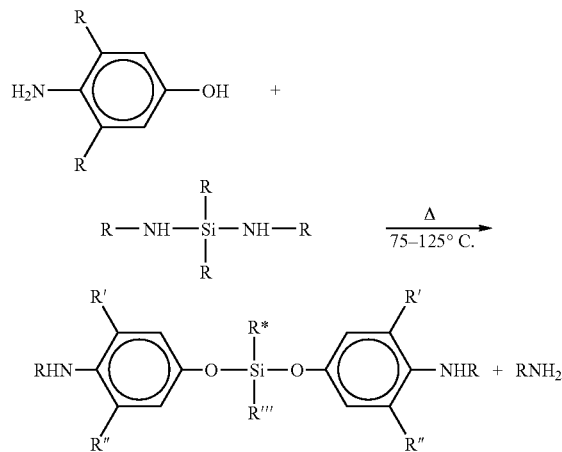

By using siloxane-based aromatic diamines, the formulation, such as an underfill formulation or molding compound is expected to have increased flexibility. Increased flexibility is believed to derive from the silicon-oxygen bonds (—O—Si—O—) that make up the siloxane-based aromatic diamine. The flexibility may result in lowering of the modulus of the matrix. Stress is believed to be directly related to modulus so lower package stress, for example, is anticipated. Lower package stress should also result in better reliability performance of the material/package. Further, siloxanes are known to provide excellent fracture toughness, due to presence of flexible —O—Si—O— bonds. Resins (e.g., epoxy resins) using siloxane-based aromatic diamine hardeners, when cured, are expected to provide improved fracture toughness over prior art resins. Siloxane-based systems are also known to have low surface energy and to be moisture resistant. Thus, the use of siloxane-based aromatic diamine hardeners should decrease the overall moisture absorption of a resin (e.g., an epoxy resin as an underfill formulation or molding compound). Further, siloxanes generally have excellent thermal stability. Thus, the thermal stability of a resin (e.g., epoxy resin as an underfill formulation or molding compound) is expected to be improved. Finally, suitable siloxane-based aromatic diamines are those that, when used as a hardener in an underfill formulation or molding compound, may be compatible with lead-free solder conditions. In one embodiment, suitable siloxane-based aromatic diamine hardeners, when used in an underfill formulation or molding compound with an epoxy may be cured at temperatures less than 200 ¡C. In another embodiment, suitable curing temperatures are on the order of 150 ¡C to 175 ¡C.

FIG. 1 shows an embodiment of an electronic assembly including a package connected to a printed circuit board (PCB). The electronic assembly may be part of an electronic system such as a computer (e.g., desktop, laptop, hand-held, server, Internet appliance, etc.), a wireless communication device (e.g., cellular phone, cordless phone, pager), a computer-related peripheral (e.g., printer, scanner, monitor), an entertainment device (e.g., television, radio, stereo, tape player, compact disk player, video cassette recorder, MP3 (Motion Picture Experts Group, Audio Layer 3 player) and the like.

In the embodiment shown in FIG. 1, electronic assembly 100 includes chip or die 110, having a number of circuit devices formed thereon and therein, connected to package substrate 120. Chip 110 is electrically connected to a package substrate 120, in this embodiment, through solder connections 130 (shown as solder balls) between corresponding contact pads on chip 110 and package substrate 120, respectively.

Disposed between chip 110 and package substrate 120 is underfill formulation 135. In one embodiment, underfill formulation 135 is an epoxy-based system including an epoxy (e.g., bisphenol-A, bisphenol-F, napthalene-based) and a siloxane-based aromatic diamine hardener such as a siloxane-based aromatic diamine described with reference to Formula I and the accompanying text. In one embodiment, the epoxy and hardener are pre-mixed in a solution then dispensed along a side or an edge of chip 110 to flow between chip 110 and package substrate 120. In another embodiment, the epoxy and hardener are mixed as they are dispensed. With respect to individual amounts of epoxy and hardener, suitable amount for each is that amount that will polymerize the epoxy system composition such that it forms a solid on cure. Representatively, amounts of epoxy to hardener include as much as 0.75 to 1.25 mole ratio.

Figure 2:
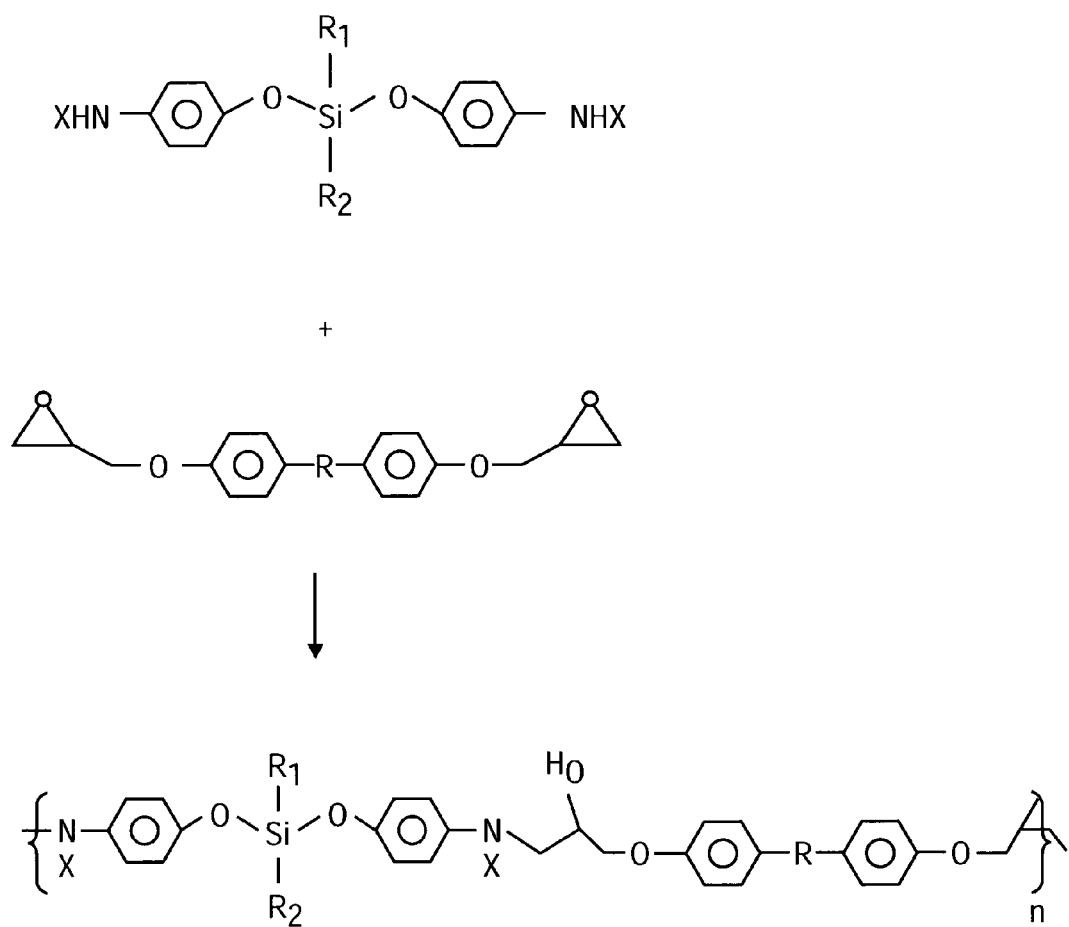
FIG. 2 shows one cure mechanism for a siloxane-based aromatic diamine and a phenolic-based epoxy.

FIG. 2 illustrates a representation of a siloxane-based aromatic diamine as a hardener in, for example, an underfill formulation or molding compound and shows the combination (e.g., reaction product) of the siloxane-based aromatic diamine with an epoxy. In this one example, the epoxy is a phenolic-based epoxy.

Referring again to FIG. 1, in one embodiment, underfill formulation 135 is dispensed between chip 110 and package substrate 120. One technique is to dispense underfill formulation 135 on package substrate 120 along one side of chip 110 so that underfill formulation 135 flows under chip 110. Underfill formulation 135 is dispensed in sufficient amount to fill any gap between chip 110 and package substrate 120 and to surround connections 130. Following dispensing of underfill formulation 135, the formulation is cured to harden/solidify underfill formulation 135 through, for example, a polymerization process. A representative curing temperature is up to 200° C. for a lead-free solder process. In another embodiment, a suitable curing temperature is on the order of 150° C. to 175° C.

In the embodiment shown in FIG. 1, electronic assembly 100 includes molding compound 140 formed over chip 110 and package substrate 120. In one embodiment, molding compound 140 is an epoxy-based system including an epoxy (e.g., bisphenol-A, bisphenol-F, napthalene-based) and a siloxane-based aromatic diamine such as a siloxane-based aromatic diamine hardener described with reference to Formula I and the accompanying text. In another embodiment, the hardener is selected from a prior art hardener. In either embodiment, molding compound 140 may also include a filler material such as a ceramic that, in one embodiment, allows molding compound 140 to be pre-formed into a disk or similar structure. In such manner, molding compound 140 may be applied to chip 110 and package substrate 120 through a mold press and cured to flow and encapsulate chip 110. Alternatively, molding compound 140 may be dispensed on chip 110 and package substrate 120 in a solution or semi-solution form and cured as described above with reference to underfill formulation 135.

FIG. 1 shows package substrate 120 connected to printed circuit board (PCB) 150. PCB is, for example, a motherboard or other circuit board. Package substrate 120 is connected to PCB 150 through connections 155 such as lead-free solder connections. PCB 150 may include other components, possibly connected to chip 110 through traces embedded in PCB 150. Representatively, FIG. 1 shows unit 160 that is, for example, a memory device, a power source device or other device.

In the preceding paragraphs, specific embodiments are described. It will, however, be evident that various modifications and changes may be made thereto without departing from the broader spirit and scope of the claims. The specification and drawings are, accordingly, to be regarded in an illustrative rather than a restrictive sense.

What is claimed is:

1. An apparatus comprising:
a first substrate comprising a first set of contact points;
a second substrate comprising a second set of contact points coupled to the first substrate through interconnections between a portion of the first set of contact points and a portion of the second set of contact points;
a composition disposed between the first substrate and the second substrate comprising a siloxane-based aromatic diamine, wherein the composition comprises a reaction product between a siloxane-based aromatic diamine and an epoxy resin, and wherein the siloxane-based aromatic diamine has a formula:

Formula I

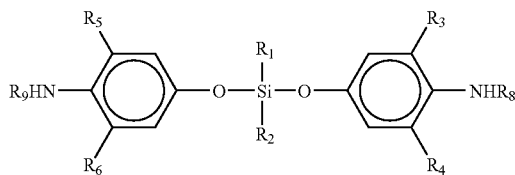

wherein groups $R_1$ and $R_2$ are independently selected from a hydrogen, an alkyl, a substituted alkyl, a cycloaliphatic, an alkyl ether, an aryl, a substituted aryl moiety, and an —$OR_7$ moiety, wherein $R_7$ is selected from an aliphatic and an aromatic moiety,
wherein groups $R_3$, $R_4$, $R_5$, and $R_6$ are independently selected from a hydrogen, an alkyl, a substituted alkyl, a cycloaliphatic, an alkyl ether, an aryl, and a substituted aryl moiety, and
wherein groups $R_8$ and $R_9$ are independently selected from a hydrogen, an alkyl, a cycloaliphatic, an alkyl ether, an aryl, and a substituted aryl moiety.

2. The apparatus of claim 1, wherein groups $R_1$ and $R_2$ comprise a methyl moiety, groups $R_3$, $R_4$, $R_5$, and $R_6$ comprise a hydrogen moiety, and groups $R_8$ and $R_9$ comprise a hydrogen moiety.

3. The apparatus of claim 1, wherein groups $R_1$ and $R_2$ comprise a methyl moiety, groups $R_3$ and $R_5$ comprise a hydrogen moiety, groups $R_4$ and $R_6$ comprise a propyl moiety, and groups $R_8$ and $R_9$ comprise a hydrogen moiety.

4. The apparatus of claim 1, wherein groups $R_1$ and $R_2$ comprise a methyl moiety, groups $R_3$, $R_4$, $R_5$, and $R_6$ comprise a methyl moiety, and groups $R_8$ and $R_9$ comprise a hydrogen moiety.

5. The apparatus of claim 1, wherein groups $R_1$ and $R_2$ comprise a methyl moiety, groups $R_3$, $R_4$, $R_5$, and $R_6$ comprise a propyl moiety, and groups $R_8$ and $R_9$ comprise a hydrogen moiety.

6. The apparatus of claim 1, wherein groups $R_1$ and $R_2$ comprise a methyl moiety, groups $R_3$, $R_4$, $R_5$, and $R_6$ independently comprise one of a hydrogen moiety and a $C_1$ to $C_6$ alkyl moiety, and groups $R_8$ and $R_9$ comprise a hydrogen moiety.

7. The apparatus of claim 1, wherein one of groups $R_1$ and $R_2$ comprises a methyl moiety and the other comprises a phenyl moiety, groups $R_3$, $R_4$, $R_5$, and $R_6$ comprise a hydrogen moiety, and groups $R_8$ and $R_9$ comprise a hydrogen moiety.

8. The apparatus of claim 1, wherein one of groups $R_1$ and $R_2$ comprises a methyl moiety and the other comprises a phenyl moiety, groups $R_3$, $R_4$, $R_5$, and $R_6$ independently comprise one of a hydrogen moiety and a $C_1$ to $C_6$ alkyl moiety, and groups $R_8$ and $R_9$ comprise a hydrogen moiety.

9. The apparatus of claim 1, wherein one of groups $R_1$ and $R_2$ comprises a methyl moiety and the other comprises a an —$OR_7$ moiety, wherein $R_7$ comprises an amine, groups $R_3$, $R_4$, $R_5$, and $R_6$ independently comprise one of a hydrogen moiety and a $C_1$ to $C_6$ alkyl moiety, and groups $R_8$ and $R_9$ comprise a hydrogen moiety.

10. The apparatus of claim 1, wherein the second substrate comprises an integrated circuit.

11. The apparatus of claim 1, wherein the first substrate comprises a circuit package and the second substrate comprises a printed circuit board.

\* \* \* \* \*